Oct. 30, 1962 J. W. BATTIN 3,061,785

TRANSISTOR PROTECTING CIRCUIT

Filed April 8, 1960

INVENTOR.
John W. Battin
BY Mueller & Aichele
Attys.

3,061,785
Patented Oct. 30, 1962

3,061,785

TRANSISTOR PROTECTING CIRCUIT

John W. Battin, Addison, Ill., assignor to Motorola, Inc., Chicago, Ill., a corporation of Illinois Filed Apr. 8, 1960, Ser. No. 20,984
4 Claims. (Cl. 325—362)

Figures 1, 2:
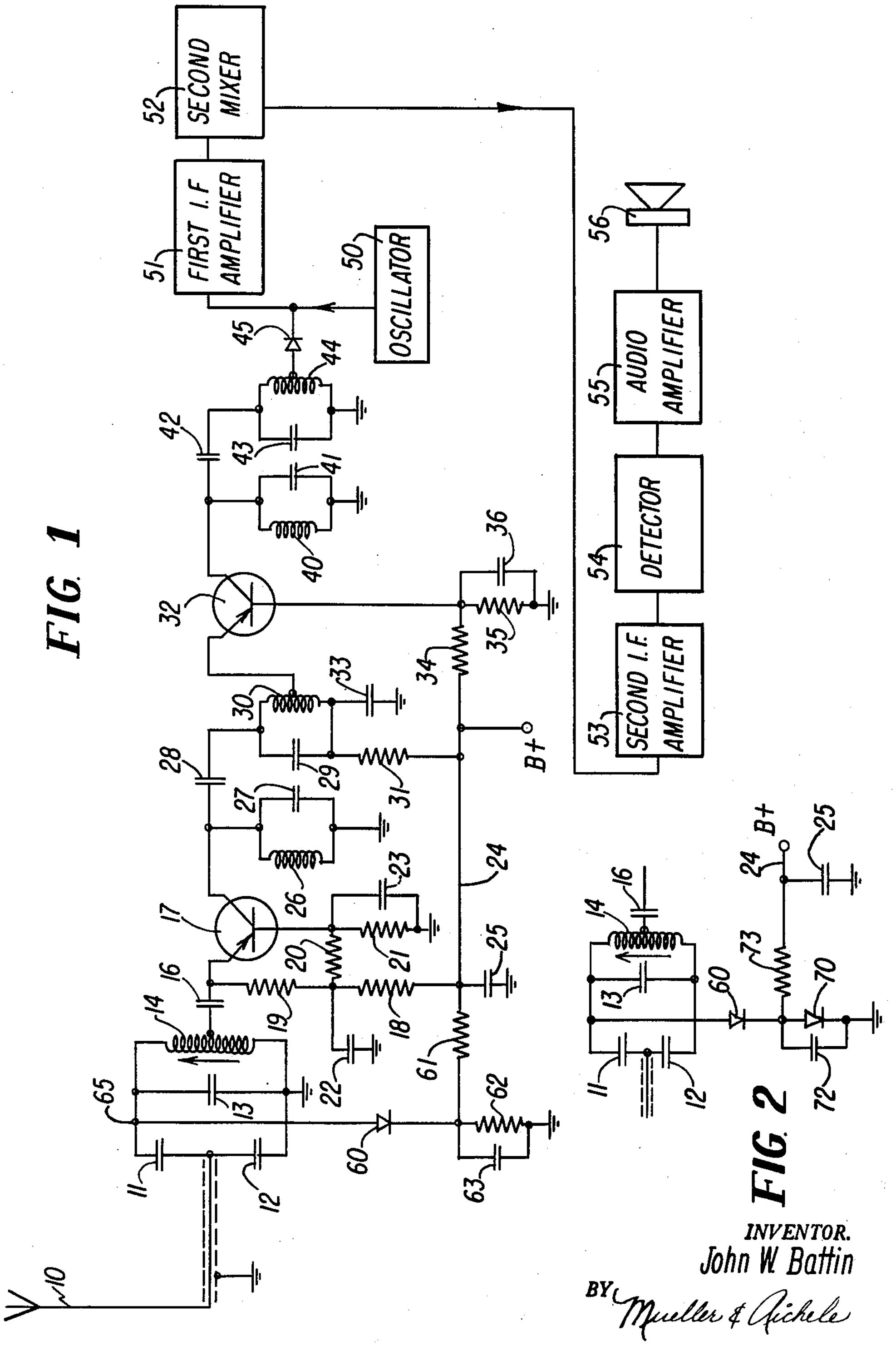

This invention relates generally to radio receivers and more particularly to a protective device for protecting transistors used in radio receivers from damage resulting from reception of strong signals.

Because of the reduced size and weight, and the smaller power required for operation, the current trend is to replace vacuum tubes used in radio receivers and the like with transistors. In mobile radio equipment it is highly desirable to use transistors inasmuch as the saving in size and weight is quite material, and the current required for operation is much less so that the load on vehicle electrical systems is reduced. However, transistors available for certain applications are extremely fragile and are subject to damage when strong currents are applied thereto.

A particular problem is presented when mobile radio receivers are positioned extremely close to a transmitter of the system as in such case extremely strong signals may be applied to the receiver. For example, in two-way mobile systems with the radio equipment installed in cars, the cars may be side by side so that the antennas extending therefrom are closely adjacent to each other. In such case signals transmitted from the radio unit of one car will provide extremely strong signals in the receiver of the adjacent car. Such signals when applied to the transistors in the input stages of the receiver may damage the transistors so that they must be replaced.

It is therefore an object of the present invention to provide a system to protect transistors in radio equipment from damage resulting from strong received signals.

A further object of the invention is to provide a system for reducing input signals applied to a transistor so that the signals will not be at a level which will damage the transistor.

A feature of the invention is the provision of a protecting circuit for transistor input stages of a radio receiver which includes a variable impedance device which provides a low impedance across the input circuit to the transistor stages when the input signal reaches a predetermined level to load the coupling circuit so that the receiver is decoupled from the signal source and signals applied to a transistor stage are reduced to a level which may safely be handled by the transistor.

Another feature of the invention is the provision of a signal translating stage having one or more tuned input circuits and a transistor, with a protecting circuit connected across one of the tuned circuits including a diode and a biasing circuit therefore which holds the diode normally non-conducting so that it does not affect the operation of the tuned circuit, but in which the diode conducts when the input signals reach a value to overcome the bias and presents a low impedance across the tuned circuit to load the same so that the signals therein are reduced.

A further feature of the invention is the provision of a protecting circuit including a diode and a biasing circuit, therefore, in which the biasing circuit includes a non-linear element such as a diode, the voltage across which does not change substantially with increasing current therethrough, so that the operating point of the protecting circuit remains substantially the same when current is applied to the biasing circuit from the protecting circuit in the presence of strong signals.

The invention is illustrated in the drawing wherein:

FIG. 1 shows a radio receiver including the protecting circuit of the invention; and FIG. 2 shows an alternate embodiment of the protecting circuit.

The invention may be utilized in any transistor stage having an input circuit, such as the radio frequency amplifier stages of a radio receiver, which utilize transistors as the active element. The input signal from an antenna is applied to a tuned input circuit which in turn applies increased signals to the first transistor. As the level of received signals is increased by resonance action in the input circuit, when strong signals are picked up at the antenna, an even stronger signal will be applied to the first transistor. For preventing damage to this transistor, a protection circuit is provided which is connected across the tuned input circuit of the receiver. This includes a device which selectively presents a high impedance or a low impedance, such as a diode connected in series with a bias circuit which holds the diode normally non-conducting. When the input signal reaches a level to overcome the bias, the diode conducts and presents a low impedance across the input circuit. This will load the input circuit so that the gain thereof is reduced and decouples the first transistor from the antenna so that the signal applied to the first transistor is materially reduced. By properly selecting the bias applied to the diode, it is possible to hold the level of the signals applied from the input circuit to the transistor at a level which will not damage the transistor. The bias may be developed by a voltage divider which includes a non-linear element, such as a diode, so that the operating point does not change substantially as the protecting diode conducts to apply current to the divider element.

Referring now to FIG. 1 of the drawing, an antenna 10 is provided for picking up signals which are applied to the receiver. This may be a whip antenna, as usually provided on a vehicle, or any other antenna for picking up electromagnetic waves. The signals from the antenna are applied to an input circuit which includes capacitors 11, 12 and 13, and coil 14. Capacitors 11 and 12 are selected to provide the desired input impedance for matching the antenna and the coil 14 is tapped to provide the required output impedance. The circuit is tuned to the frequency to be received so that a resonant gain is provided and the output signal is at a substantially higher voltage than the input signal applied thereto. The output signal is applied from a tap on coil 14 through coupling condenser 16 to the emitter electrode of transistor 17 which operates as a radio frequency amplifier.

The radio frequency amplifier stage includes resistors 18, 19, 20, and 21 which provide the required bias potentials to the emitter and base electrodes of the transistor. Capacitors 22 and 23 provide signal bypass so that the transistor 17 may operate effectively as a radio frequency amplifier. The bias voltage is obtained from the B+ line 24 which is bypassed by capacitor 25. A tuned output circuit including coil 26 and capacitor 27 is connected to the collector electrode of transistor 17, with the output signal being applied through coupling capacitor 28 to a second tuned circuit including capacitor 29 and coil 30. Signals are derived from the coil 30 which is tapped to provide the desired impedance for applying signals to the emitter electrode of transistor 32 which forms a second radio frequency amplifier stage.

The second stage includes resistor 31 which provides a bias voltage from the line 24 to the emitter electrode of transistor 32, with capacitor 33 providing bypass. Bias potential is applied to the base electrode of transistor 32 by the voltage divider including resistors 34 and 35 with capacitor 36 bypassing the base electrode. The output of the transistor 32 is derived from the collector electrode and is applied to a tuned circuit including coil 40 and capacitor 41. This tuned circuit is coupled through capacitor 42 to a second circuit including capacitor 43 and coil 44. Coil 44 is tapped to provide the required input impedance to diode detector 45.

Signals from the local oscillator 50 are applied to the diode 45, along with the radio frequency signals, and the diode forms a first mixer to provide a first frequency conversion. The first intermediate frequency signals are selected and amplified by intermediate frequency amplifier 51. This intermediate frequency signal may be detected or may be applied to a second mixer 52 which further reduces the frequency. The output from mixer 52 is amplified in second intermediate frequency amplifier 53. The second intermediate frequency signals may be applied to detector 54 where the modulating signals are derived. The receiver may be of the amplitude or frequency modulation type or of any other type desired. The modulating signals are applied through audio amplifier 55 and reproduced in loudspeaker 56. Although a loudspeaker is illustrated it is obvious that any other type of translating unit may be used.

It has been found that in mobile receivers wherein the antenna may be positioned in a very strong signal area the signal applied to the input circuit, and stepped up therein, may be of such a high value that it damages the transistors 17 and 32 in the input stages of the receiver. Although the input stages are illustrated in the figure as radio frequency amplifier stages, these might be converter stages or any other stages to which the input signal is applied. Strong signals safely applied through an input stage may damage a further stage.

To prevent damage to transistors of the receiver, a protecting circuit is provided including the diode 60 and a bias circuit therefore including resistors 61 and 62 and capacitor 63. Resistors 61 and 62 are connected to the voltage line 24 and the values are selected so that the voltage appearing across resistor 62 provides the desired bias voltage to the diode 60. When the signal across the input circuit falls below the value of the bias, the diode 60 will not conduct and will have a high impedance so that it has substantially no effect on the operation of the circuit. However, when the voltage at the high potential point 65 of the input circuit exceeds that of the bias provided across resistor 62, the diode 60 will conduct.

When the diode 60 conducts, this provides a low impedance shunt across the input circuit which loads the circuit so that the resonant action will be greatly decreased. Further, shunting of the input circuit will decouple the radio frequency amplifier transistors from the antenna. These two effects will greatly reduce the voltage applied to the transistor 17 and this voltage is therefore held at a value which can be safely handled thereby. This effectively protects the transistor 17 and will also reduce the signal applied to transistor 32 in the second radio frequency amplifier stage to protect this transistor. The reduction of excessive voltage at the input of the receiver will also effectively protect further stages of the receiver if there is any problem in such stages.

In FIG. 2 there is illustrated a second embodiment of the protecting circuit wherein the biasing means for the protecting diode is provided by a non-linear resistance element such as a second diode. The circuit of FIG. 2 may be exactly as shown in FIG. 1 except that the resistor 62 of the bias circuit is replaced by the diode 70. The diode 70 is bypassed by capacitor 72 and is connected to the B+ line 24 through resistor 73. In this circuit the resistor 73 may be quite large as the diode 70 can be of a type which provides the desired voltage thereacross with a very small current flowing therethrough. Although the voltage across the diode 70 will increase as increased current flows therethrough being provided by diode 60, the rate of increase of the voltage will be less than the rate of increase of the current.

For example, the diode 70 may provide a voltage drop of .6 volt with current of one mil flowing therethrough. This therefore consumes very little power from the B+ source. When the voltage across the tuned circuit exceeds the voltage across diode 70, the diode 60 will conduct and current will flow from the resonant circuit through diodes 60 and 70. However this current may increase substantially without greatly changing the voltage across diode 70. For example, the diode 70 may provide a voltage of only .8 volt thereacross when a current as large as 50 mils flows through the diode. This makes it possible to protect for extremely strong signals without substantially changing the operating point of the protective circuit.

This operation of the circuit of FIG. 2 is to be contrasted with the circuit of FIG. 1 in which the voltage across resistor 62 will increase linearly with current applied thereto. In FIG. 1, it is necessary to keep the value of resistor 62 low to provide effective protecting action. When the resistor 62 has a low value, the resistor 62 must also have a relatively low value to provide the required voltage level for biasing the diode 60. The resistors 61 and 62 in series will therefore have a relatively low resistance which will consume substantial power from the B+ supply. In receivers in which extremely strong signals will not be present, the circuit of FIG. 1 has been found to be entirely satisfactory. In receivers in which extremely strong signals are encountered, the circuit of FIG. 2 is advantageous both because it consumes less power and because it holds the operating point of the protecting action at a substantially fixed value as the signal levels change over a wide range.

The protecting circuit may include any variable impedance device connected across the input coupling circuit which normally presents a high impedance and which is biased to respond to a signal of a predetermined level to provide a low impedance so that the input circuit is effectively shunted. A simple diode biased to a desired operating point is effective to provide the desired action.

The protecting circuit of the invention may be applied to any stage having a tuned input circuit which can be loaded and detuned as described. The circuit is quite simple and inexpensive and has been found to be highly effective in actual use. The design and operation of the circuit is not critical and the bias may be set to permit operation on signals up to any level which may cause trouble, without affecting operation at lower signal levels.

I claim:

1. In a radio receiver for use in a vehicle and having an antenna which may receive strong signals, and which receiver includes a tuned input circuit followed by a transistor, the combination including, a protecting circuit for the transistor connected across the input circuit, said protecting circuit including diode means and bias means therefore, said bias means being independent of the signal applied to the transistor and including a non-linear element across which a bias voltage is developed which normally holds said diode means non-conductive and allows said diode means to conduct when the voltage across the input circuit exceeds a predetermined value, said diode means when conducting presenting a low impedance across the input circuit to load the same so that the level of signals therein is reduced, whereby signals received in said input circuit having a value exceeding said predetermined value are reduced before application to the transistor stage, said non-linear element providing a voltage thereacross which increases at less than a linear rate when current is applied thereto by said diode means.

2. In a transistor stage having a tuned input circuit which may apply strong signals to the transistor of the stage, the combination including, a protecting circuit for the transistor connected across the input circuit, said protecting circuit including a first diode and bias means therefor, said bias means including a second diode and means for applying a direct current voltage to said second diode for developing a bias voltage thereacross which normally holds said first diode nonconductive and allows said first diode to conduct when the voltage across the input circuit exceeds a predetermined value, said first diode when conducting presenting a low impedance across the input circuit to load the same and to prevent the translation of signals thereby to the transistor, whereby signals in the input circuit having a value exceeding said predetermined value are reduced before application to the transistor, said first diode when conducting applying current to said second diode, and said second diode having a characteristic such that the voltage thereacross increases at a lesser rate than the increase in current therethrough.

3. A transistor stage including in combination, an input circuit, a transistor having an electrode connected to said input circuit, and a protecting circuit including first and second diodes connected in series across said input circuit, and means applying current to said second diode to provide a voltage thereacross which normally exceeds the voltage at said input circuit so that said first diode is held non-conducting and said protecting circuit has high impedance, said first diode being rendered conducting in response to a voltage across said input circuit which exceeds the voltage across said second diode, said diodes when both are conducting presenting a low impedance across said input circuit acting to load the same so that the level of signals therein is reduced, whereby signals in said input circuit having a value exceeding the voltage across said first diode are reduced before application to said transistor, said second diode having a characteristic such that the voltage thereacross increases at a lesser rate than the rate of increase in current therethrough, so that current through said diodes in response to increased voltage across said input circuit does not substantially change the voltage at which said protecting circuit operates.

4. A protecting circuit for use with a transistor stage which includes a transistor and an input circuit coupled thereto, said protecting circuit being connected across the input circuit and including diode means and bias means, said bias means providing a bias to said diode means which is independent of the signal applied to the transistor, said bias means including a non-linear impedance element across which a bias voltage is developed which normally holds said diode means nonconductive and which allows said diode means to conduct when the voltage across the input circuit exceeds a predetermined value, said diode means when conducting presenting a low impedance across the input circuit to load the same so that the level of signals therein is reduced, whereby signals received in said input circuit having a value exceeding said predetermined value are reduced before application to the transistor stage, said non-linear element providing a voltage thereacross which increases at less than a linear rate in response to current applied to said bias means by said diode means when the same is rendered conducting.

References Cited in the file of this patent

UNITED STATES PATENTS

| | | |
|---|---|---|
| 2,397,167 | Stodola | Mar. 26, 1946 |
| 2,434,929 | Holland et al. | Jan. 27, 1948 |
| 2,654,834 | Zarky | Oct. 6, 1953 |
| 2,691,775 | Marcum | Oct. 12, 1954 |
| 2,774,866 | Burger | Dec. 18, 1956 |
| 2,808,474 | Maynard et al. | Oct. 1, 1957 |
| 2,898,411 | Chow | Aug. 4, 1959 |
| 2,937,341 | Aram | May 17, 1960 |
| 2,945,121 | Bradmitter | July 12, 1960 |
| 2,993,128 | Carroll | July 18, 1961 |

FOREIGN PATENTS

| | | |
|---|---|---|
| 218,073 | Australia | Apr. 4, 1957 |